United States Patent
Cai

(10) Patent No.: US 11,882,718 B2
(45) Date of Patent: Jan. 23, 2024

(54) DISPLAY PANEL AND DISPLAY DEVICE INCLUDING MONITORING ELEMENT

(71) Applicant: WUHAN CHINA STAR OPTOELECTRONICS SEMICONDUCTOR DISPLAY TECHNOLOGY CO., LTD., Hubei (CN)

(72) Inventor: Zhenfei Cai, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 448 days.

(21) Appl. No.: 17/261,774

(22) PCT Filed: Aug. 12, 2020

(86) PCT No.: PCT/CN2020/108685
§ 371 (c)(1),
(2) Date: Jan. 20, 2021

(87) PCT Pub. No.: WO2022/027718
PCT Pub. Date: Feb. 10, 2022

(65) Prior Publication Data
US 2022/0302409 A1    Sep. 22, 2022

(30) Foreign Application Priority Data
Aug. 6, 2020  (CN) .......................... 202010782514.2

(51) Int. Cl.
*H10K 50/84* (2023.01)
*H10K 59/12* (2023.01)

(52) U.S. Cl.
CPC ............. *H10K 50/84* (2023.02); *H10K 59/12* (2023.02)

(58) Field of Classification Search
CPC .............................. H10K 50/84; H10K 59/12
USPC .......................................................... 257/40
See application file for complete search history.

(56) References Cited

U.S. PATENT DOCUMENTS

| | | | |
|---|---|---|---|
| 2019/0097162 A1* | 3/2019 | Wang | H10K 50/81 |
| 2020/0013834 A1* | 1/2020 | Park | H10K 59/88 |
| 2021/0343815 A1* | 11/2021 | Seo | H10K 59/124 |

FOREIGN PATENT DOCUMENTS

| | | |
|---|---|---|
| CN | 108649053 A | 10/2018 |
| CN | 109786581 A | 5/2019 |
| CN | 110600515 A | 12/2019 |
| CN | 111180498 A | 5/2020 |
| CN | 111490083 A | 8/2020 |
| JP | 2005109127 A | 4/2005 |

* cited by examiner

Primary Examiner — Xia L Cross

(57) ABSTRACT

A display panel and a display device are provided. The display panel includes a display region and a non-display region surrounding the display region. In the present invention, a monitoring portion is disposed in the non-display region of the display panel, and a plurality of light-emitting elements are disposed in a frame packaging region. By observing light-emitting conditions of the light emitting elements at different distances from the display region of the display panel, packaging effects of different packaging structures can be effectively detected.

20 Claims, 2 Drawing Sheets

DISPLAY PANEL AND DISPLAY DEVICE INCLUDING MONITORING ELEMENT

FIELD OF INVENTION

The present invention relates to the field of display technologies, and in particular, to a display panel and a display device.

BACKGROUND OF INVENTION

Active matrix organic light-emitting diodes (AMOLED) are expected to replace liquid crystals to become a mainstream choice of next-generation displays due to their high contrast, wide viewing angles, fast response time, and flexibility.

Since luminescent materials used in OLED is sensitive to water and oxygen, once the water and oxygen enter, elements will fail and will not emit light. Therefore, a reliability of OLED packaging is required to be as high as possible. Therefore, it is usually necessary to verify a packaging effect of different packaging materials and packaging structures in a design stage, but it is often necessary to make a panel be more reliable for verification. However, frame sizes of the panel are generally fixed. After water vapor enters the panel, it needs to slowly pass through frame regions and then enter display regions to affect light-emitting pixels, but this takes a long time. In addition, if two materials or structures have good packaging effects, the pixels in the display regions are likely to not fail, so it is difficult to compare advantages and disadvantages of the two structures.

Technical Problem

The present invention provides a display panel and a display device to solve a problem in the prior art that it is difficult to compare advantages and disadvantages of materials or structures with better packaging effects.

Technical Solution

In order to solve the above problems, technical solutions provided by the present invention are as follows:

A display panel, comprises a display region and a non-display region surrounding the display region;

the display panel comprises a substrate, a light emitting unit, and a thin film packaging layer;

wherein a boundary of the thin film packaging layer is correspondingly disposed in the non-display region, and a frame packaging region is formed between the boundary of the thin film packaging layer and a boundary of the display region;

wherein the display panel further comprises a monitoring portion disposed on the substrate and located in the non-display region; and wherein the light emitting unit comprises a plurality of light emitting elements disposed in the frame packaging region, the monitoring portion is electrically connected to the light emitting elements in the frame packaging region, and an opposite side of the monitoring portion that is electrically connected to the light emitting elements is provided with a plurality of signal loading terminals.

In the display panel of the present invention, the monitoring portion is disposed on a side of the frame packaging region away from the display region, and the monitoring portion is electrically connected to the light emitting element in the frame packaging region through a connecting line.

In the display panel of the present invention, the light emitting unit comprises odd rows of light emitting elements and even rows of light emitting elements arranged crosswise, and the odd rows of light emitting elements and the even rows of light emitting elements are disposed in parallel.

In the display panel of the present invention, the monitoring portion comprises a first signal loading terminal electrically connected to the odd rows of light emitting elements and a second signal loading terminal electrically connected to the even rows of light emitting elements.

In the display panel of the present invention, the odd rows of light emitting elements and the even rows of light emitting elements are evenly distributed in the frame packaging region.

In the display panel of the present invention, distances between the odd rows of light emitting elements and the even rows of light emitting elements from the display region are not equal.

In the display panel of the present invention, both the monitoring portion and the light emitting unit comprise a thin film transistor layer, and the thin film transistor layer of the monitoring portion and the thin film transistor layer of the light emitting unit are formed by a same process.

In the display panel of the present invention, the thin film transistor layer is disposed on an upper surface of the substrate, the thin film transistor layer comprises a first buffer layer, a base, a second buffer layer, a composite layer, a first gate insulating layer, a second gate insulating layer, a dielectric layer, and a planarization layer from bottom to top.

In the display panel of the present invention, the light emitting unit comprises a first light emitting element layer disposed on the thin film transistor layer and corresponding to the display region, and a second light emitting element layer disposed corresponding to the non-display region, the second light emitting element layer comprises an anode, a light-emitting layer, and a cathode that are stacked.

In the display panel of the present invention, the thin film transistor layer corresponding to the monitoring portion comprises an active layer and an electrode layer that are stacked, the electrode layer comprises a first electrode layer and a second electrode layer disposed at intervals, the anode is electrically connected to the first electrode layer, and signal transmission between the monitoring portion and the first electrode layer is carried out through the anode and the light emitting element.

The present invention further provides a display device comprising a display panel, wherein the display panel comprises a display region and a non-display region surrounding the display region;

wherein the display panel comprises a substrate, a light emitting unit, and a thin film packaging layer;

wherein a boundary of the thin film packaging layer is correspondingly disposed in the non-display region, and a frame packaging region is formed between the boundary of the thin film packaging layer and a boundary of the display region;

wherein the display panel further comprises a monitoring portion disposed on the substrate and located in the non-display region; and wherein the light emitting unit comprises a plurality of light emitting elements disposed in the frame packaging region, the monitoring portion is electrically connected to the light emitting elements in the frame packaging region, and an opposite side of the monitoring portion that is electrically connected to the light emitting elements is provided with a plurality of signal loading terminals.

In the display device of the present invention, the monitoring portion is disposed on a side of the frame packaging region away from the display region, and the monitoring portion is electrically connected to the light emitting element in the frame packaging region through a connecting line.

In the display device of the present invention, the light emitting unit comprises odd rows of light emitting elements and even rows of light emitting elements arranged crosswise, and the odd rows of light emitting elements and the even rows of light emitting elements are disposed in parallel.

In the display device of the present invention, the monitoring portion comprises a first signal loading terminal electrically connected to the odd rows of light emitting elements, and a second signal loading terminal electrically connected to the even rows of light emitting elements.

In the display device of the present invention, the odd rows of light emitting elements and the even rows of light emitting elements are evenly distributed in the frame packaging region.

In the display device of the present invention, distances between the odd rows of light emitting elements and the even rows of light emitting elements from the display region are not equal.

In the display device of the present invention, both the monitoring portion and the light emitting unit comprise a thin film transistor layer, and the thin film transistor layer of the monitoring portion and the thin film transistor layer of the light emitting unit are formed by a same process.

In the display device of the present invention, the thin film transistor layer is provided on an upper surface of the substrate, the thin film transistor layer comprises a first buffer layer, a base, a second buffer layer, a composite layer, a first gate insulating layer, a second gate insulating layer, a dielectric layer, and a planarization layer from bottom to top.

In the display device of the present invention, the light emitting unit comprises a first light emitting element layer disposed on the thin film transistor layer and corresponding to the display region and a second light emitting element layer disposed corresponding to the non-display region, and the second light emitting element layer comprises an anode, a light-emitting layer, and a cathode that are stacked.

In the display device of the present invention, the thin film transistor layer corresponding to the monitoring portion comprises an active layer and an electrode layer that are stacked, the electrode layer comprises a first electrode layer and a second electrode layer disposed at intervals, the anode is electrically connected to the first electrode layer, and signal transmission between the monitoring portion and the first electrode layer is carried out through the anode and the light emitting element.

Beneficial Effect

In the present invention, a monitoring portion is disposed in a non-display region of a display panel, and odd rows of light emitting elements and even rows of light emitting elements are arranged crosswise in a frame packaging region. Distances between the odd rows of light emitting elements and the even rows of light emitting elements from the display region are not equal. By observing light-emitting conditions of the light emitting elements at different distances from the display region of the display panel, packaging effects of different packaging structures can be effectively detected.

DESCRIPTION OF DRAWINGS

In the following, in conjunction with the drawings, and through a detailed description of specific implementations of the present invention, technical solutions and other beneficial effects of the present invention will be apparent.

DETAILED DESCRIPTION OF PREFERRED EMBODIMENTS

The present invention provides a display panel and a display device. In order to make the purpose, technical solutions, and effects of the present invention clearer and more explicit, the following will further describe the present invention in detail with reference to the drawings and examples. It should be understood that specific embodiments described here are only used to explain the present invention, and not to limit the present invention.

Figure 1:
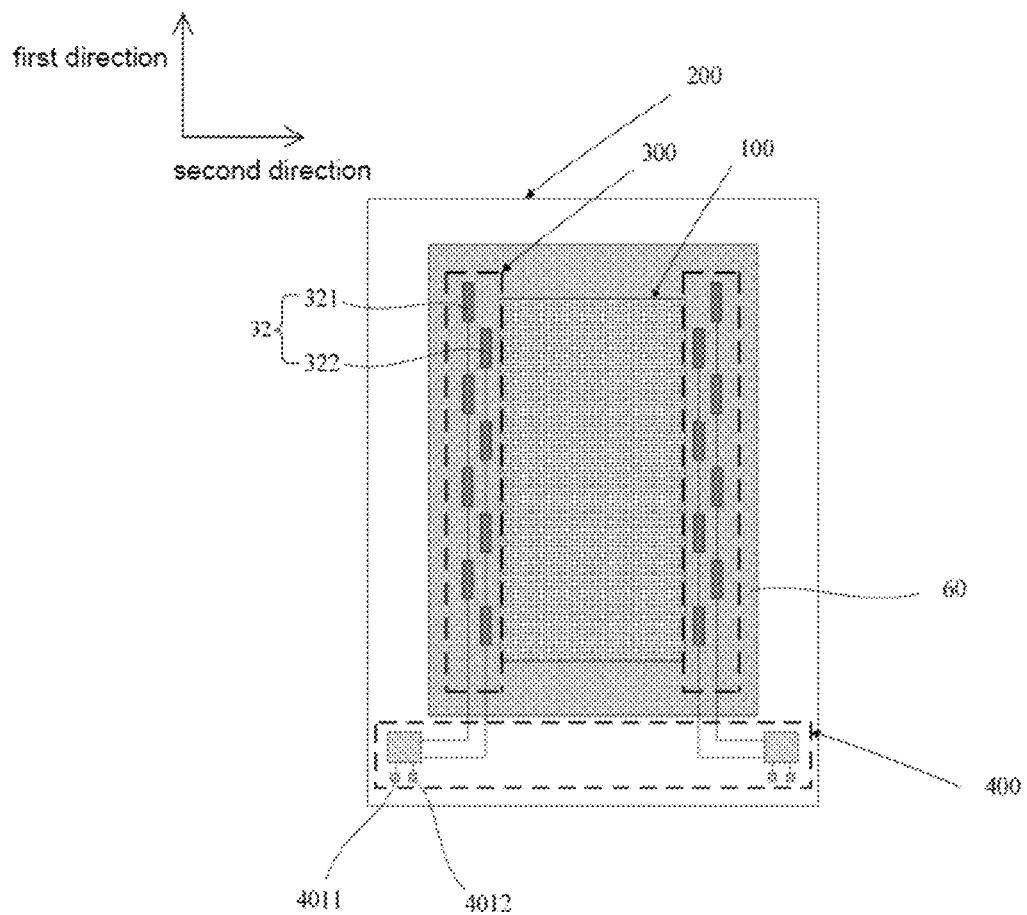
FIG. 1 is a top view of a display panel provided by an embodiment of the present invention.
Figure 2:
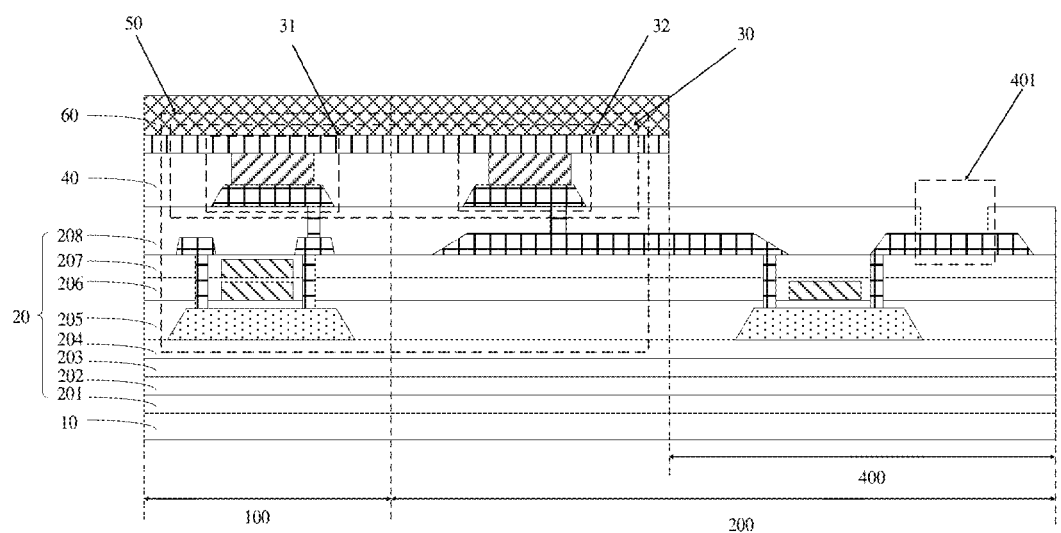
FIG. 2 is a schematic structural view of the display panel provided by the embodiment of the present invention.

Please refer to FIG. 1 to FIG. 2, a display panel comprises a display region 100 and a non-display region 200 surrounding the display region 100.

The display panel comprises a substrate 10, a light emitting unit 50, and a thin film packaging layer 60.

A boundary of the thin film packaging layer 60 is correspondingly disposed in the non-display region 200, and a frame packaging region 300 is formed between the boundary of the thin film packaging layer 60 and a boundary of the display region 100.

The display panel further comprises a monitoring portion 400 disposed on the substrate 10 and located in the non-display region 200.

The light emitting unit 50 comprises a plurality of light emitting elements 32 disposed in the frame packaging region 300. the monitoring portion 400 is electrically connected to the light emitting elements 32 in the frame packaging region 300, and an opposite side of the monitoring portion 400 that is electrically connected to the light emitting elements 32 is provided with a plurality of signal loading terminals 401.

In the present invention, the monitoring portion 400 is disposed in the non-display region 200 of the display panel, and the plurality of light emitting elements 32 are provided in the frame packaging region 300. By observing light-emitting conditions of the light emitting elements 32 in the display region 100 from a distance, packaging effects of different packaging structures can be effectively detected.

The technical solution of the present invention will now be described in conjunction with specific embodiments.

First Embodiment

Please refer to FIG. 1, which is a top view of the display panel provided in the embodiment of the present invention.

In the embodiment, the display panel comprises the display region 100 and the non-display region 200 surrounding the display region 100.

Referring to FIG. 2, the display panel comprises a substrate 10, a light-emitting unit 50, and a thin film packaging layer 60.

The boundary of the thin film packaging layer 60 is correspondingly disposed in the non-display region 200, and a frame packaging region 300 is formed between the boundary of the thin film packaging layer 60 and the boundary of the display region 100.

The display panel further comprises the monitoring portion 400 disposed on the substrate 10 and located in the non-display region 200.

In the embodiment, the light emitting unit 50 comprises the plurality of light emitting elements 32 disposed in the frame packaging region 300.

A direction in which the monitoring portion 400 points to the display region 100 is a first direction. Along the first direction, the light emitting elements 32 comprise the odd rows of light emitting elements 321 and the even rows of light emitting elements 322 arranged crosswise, and the odd rows of light emitting elements 321 and the even rows of light emitting elements 322 are disposed in parallel.

Upper edges of the odd rows of light emitting elements 321 and the even rows of light emitting elements 322 are kept on a horizontal line in the first direction.

In the embodiment, the odd rows of light emitting elements 321 and the even rows of light emitting elements 322 are evenly distributed in the frame packaging region 300.

Distances between the odd rows of light emitting elements 321 and the even rows of light emitting elements 322 from the display region 100 are not equal.

In the embodiment, a product of a number of rows of the light emitting element 32 and a width of the light emitting element 32 is equal to a width of the monitoring portion 400 in a second direction, and the second direction is perpendicular to the first direction.

In the embodiment, the monitoring portion 400 comprises a first signal loading terminal 4011 electrically connected to the odd rows of light emitting elements 321 and a second signal loading terminal 4012 electrically connected to the even rows of light emitting elements 322.

The display panel further comprises the monitoring portion 400 disposed on the substrate 10 and located in the non-display region 200.

The monitoring portion 400 is disposed on a side of the frame packaging region 300 away from the display region 100, and the monitoring portion 400 is electrically connected to the light emitting element 32 in the frame packaging region 300 through a connecting line.

Please refer to FIG. 2, which is a schematic structural view of the display panel provided by the embodiment of the present invention.

In the embodiment, the display panel comprises the substrate 10, a thin film transistor layer 20, a light emitting element layer 30, a pixel definition layer 40, and the thin film packaging layer 60.

In the embodiment, the substrate 10 may be one of a glass substrate, a quartz substrate, or a resin substrate.

The substrate 10 may also be a flexible substrate, and a material of the flexible substrate may comprise polyimide.

In the embodiment, the thin film transistor layer 20 is disposed on an upper surface of the substrate 10, the thin film transistor layer 20 comprises a first buffer layer 201, a base 202, a second buffer layer 203, a composite layer 204, a first gate insulating layer 205, a second gate insulating layer 206, a dielectric layer 207, and a planarization layer 208 from bottom to top.

It should be noted that in the embodiment, the thin film transistor layer 20 comprising the first buffer layer 201, the base 202, the second buffer layer 203, the composite layer 204, the first gate insulating layer 205, the second gate insulating layer. 206, the dielectric layer 207, and the planarization layer 208 is for illustration only. The embodiment does not limit film structures of the thin film transistor layer 20.

In the embodiment, the first buffer layer 201, the second buffer layer 203, the composite layer 204, the first gate insulating layer 205, the second gate insulating layer 206, and the dielectric layer 207 are all inorganic materials. The inorganic material includes but is not limited to one of silicon nitride, silicon oxide, or silicon oxynitride, which is not limited in the embodiment.

The thin film transistor layer 20 further comprises a first active layer, a second active layer, a first gate, a second gate, a third gate, a source/drain, and a conductive layer.

The first active layer and the second active layer are disposed on an upper surface of the composite layer 204 away from the second buffer layer 203. The first active layer and the second active layer are in a same layer and arranged at intervals.

The first active layer is disposed in the display region 100, and the second active layer is disposed in the non-display region 200.

Further, the second active layer is disposed in the monitoring portion 400.

The first gate and the second gate are disposed on an upper surface of the first gate insulating layer 205 away from the composite layer 204. The first gate and the second gate are disposed in a same layer and arranged at intervals.

The third gate is disposed on an upper surface of the second gate insulating layer 206 away from the first gate insulating layer 205. The third gate is disposed above the first gate.

The source/drain and the conductive layer are disposed on an upper surface of the dielectric layer 207 away from the second gate insulating layer 206. The source/drain and the conductive layer are in a same layer and arranged at intervals.

In the embodiment, the first active layer, the first gate, and the third gate are in one-to-one correspondence on the substrate 10. The second active layer and the second gate are in one-to-one correspondence on the substrate 10.

In the embodiment, the light emitting units 50 is disposed on the substrate 10 in an array. The light emitting unit 50 comprise the light emitting element layer 30, and the light emitting element layer 30 comprises a light emitting element 31 located in the display region 100 and a light emitting element 32 located in the non-display region.

The light emitting element 32 is located between the light emitting element 31 and the monitoring portion 400.

In the embodiment, the light emitting element 31 is located above the source/drain.

The light emitting element 31 comprises a first anode, a first light-emitting layer, and a cathode stacked in sequence. The first anode is electrically connected to the source/drain through a first via hole on the planarization layer 208.

The light-emitting element 32 comprises a second anode, a second light-emitting layer, and a cathode stacked in sequence.

The first anode and the second anode are disposed in a same layer and arranged at intervals. The first light-emitting layer and the second light-emitting layer are disposed in a same layer and arranged at intervals.

The first anode and the second anode are formed by a same process. The first light-emitting layer and the second light-emitting layer are formed by a same process.

In the embodiment, the monitoring portion 400 comprises the second active layer, the second gate, and the conductive layer that are stacked.

The second anode in the light emitting element 32 is electrically connected to the conductive layer in the monitoring portion 400 through a second via hole on the planarization layer 208.

In the embodiment, the first via hole on the planarization layer 208 is provided in the display region 100, and the second via hole is provided in the non-display region 200.

The first via hole and the second via hole are formed through a same photomask manufacturing process.

In the embodiment, the conductive layer comprises a first conductive layer electrically connected to the second anode, and a second conductive layer arranged at intervals from the first conductive layer.

Further, the first conductive layer is a signal line, and the second conductive layer is a signal loading terminal.

In the embodiment, the monitoring portion 400 is provided in the non-display region 200 of the display panel, and the odd rows of light emitting elements 31 and the even rows of light emitting elements 32 are arranged crosswise in the frame packaging region 300. The distances between the odd rows of light emitting elements 31 and the even rows of light emitting elements 32 from the display region 100 are not equal. By controlling whether a switch control signal is input or not, the light-emitting conditions of the light emitting elements 32 at different distances from the display region 100 of the display panel can be observed, which can effectively detect the packaging effects of different packaging structures.

Second Embodiment

The embodiment provides a display device comprising the display panel described in the first embodiment.

The display panel has been described in detail in the first embodiment, and the description will not be repeated here.

The present invention provides the display panel and the display device. The display panel comprises the display region and the non-display region surrounding the display region. The display panel comprises the substrate, the light emitting unit, and the thin film packaging layer. The frame packing region disposed in the non-display region is formed between the film packing layer and the substrate. The display panel further comprises the monitoring portion disposed on the substrate and located in the non-display region. The light emitting unit comprises the plurality of light emitting elements disposed in the frame packaging region, the monitoring portion is electrically connected to the light emitting elements in the frame packaging region, and the opposite side of the monitoring portion that is electrically connected to the light emitting elements is provided with the plurality of signal loading terminals.

In the present invention, the monitoring portion is disposed in the non-display region of the display panel, and the odd rows of light emitting elements and the even rows of light emitting elements are arranged crosswise in the frame packaging region. The distances between the odd rows of light emitting elements and the even rows of light emitting elements from the display region are not equal. By observing the light-emitting conditions of the light emitting elements at different distances from the display region of the display panel, the packaging effects of different packaging structures can be effectively detected.

It can be understood that for those of ordinary skill in the art, equivalent replacements or changes can be made according to the technical solutions of the present invention and its inventive concept, and all these changes or replacements shall fall within the protection scope of the claims of the present invention.

What is claimed is:

1. A display panel, comprising:
    a display region and a non-display region surrounding the display region; and
    a substrate, a light emitting unit, and a thin film packaging layer;
    wherein a boundary of the thin film packaging layer is correspondingly disposed in the non-display region, and a frame packaging region is formed between the boundary of the thin film packaging layer and a boundary of the display region;
    wherein the display panel further comprises a monitoring portion disposed on the substrate and located in the non-display region; and
    wherein the light emitting unit comprises a plurality of light emitting elements disposed in the frame packaging region, the monitoring portion is electrically connected to the light emitting elements in the frame packaging region, and an opposite side of the monitoring portion that is electrically connected to the light emitting elements is provided with a plurality of signal loading terminals.

2. The display panel as claimed in claim 1, wherein the monitoring portion is disposed on a side of the frame packaging region away from the display region, and the monitoring portion is electrically connected to the light emitting elements in the frame packaging region through a connecting line.

3. The display panel as claimed in claim 1, wherein the light emitting unit comprises first light emitting elements and second light emitting elements, the first light emitting elements are arranged in odd rows and the second emitting elements are arranged in even rows, the odd rows are parallel to the even rows, each of the first light emitting elements is staggered with each of the second light emitting elements.

4. The display panel as claimed in claim 3, wherein the monitoring portion comprises a first signal loading terminal electrically connected to the of first light emitting elements and a second signal loading terminal electrically connected to the second light emitting elements.

5. The display panel as claimed in claim 3, wherein the first light emitting elements and the second light emitting elements are evenly distributed in two side of the frame packaging region in a horizontal direction.

6. The display panel as claimed in claim 5, wherein distances between the first light emitting elements and the display region and distances between the second light emitting elements and the display region are not equal.

7. The display panel as claimed in claim 1, wherein both the monitoring portion and the light emitting unit comprise a thin film transistor layer, and the thin film transistor layer of the monitoring portion and the thin film transistor layer of the light emitting unit are formed by a same process.

8. The display panel as claimed in claim 7, wherein the thin film transistor layer is disposed on an upper surface of the substrate, and the thin film transistor layer comprises a first buffer layer, a base, a second buffer layer, a composite layer, a first gate insulating layer, a second gate insulating layer, a dielectric layer, and a planarization layer from bottom to top.

9. The display panel as claimed in claim 7, wherein the light emitting unit comprises a first light emitting element layer disposed on the thin film transistor layer and corresponding to the display region and a second light emitting element layer disposed corresponding to the non-display region, and the second light emitting element layer comprises an anode, a light-emitting layer, and a cathode that are stacked.

10. The display panel as claimed in claim 9, wherein the thin film transistor layer corresponding to the monitoring portion comprises an active layer and an electrode layer that are stacked, the electrode layer comprises a first electrode layer and a second electrode layer disposed at intervals, the anode is electrically connected to the first electrode layer, and signal transmission between the monitoring portion and the first electrode layer is carried out through the anode and the light emitting elements.

11. A display device, comprising:
a display panel, wherein the display panel comprises a display region and a non-display region surrounding the display region;
wherein the display panel comprises a substrate, a light emitting unit, and a thin film packaging layer;
wherein a boundary of the thin film packaging layer is correspondingly disposed in the non-display region, and a frame packaging region is formed between the boundary of the thin film packaging layer and a boundary of the display region;
wherein the display panel further comprises a monitoring portion disposed on the substrate and located in the non-display region; and
wherein the light emitting unit comprises a plurality of light emitting elements disposed in the frame packaging region, the monitoring portion is electrically connected to the light emitting elements in the frame packaging region, and an opposite side of the monitoring portion that is electrically connected to the light emitting elements is provided with a plurality of signal loading terminals.

12. The display device as claimed in claim 11, wherein the monitoring portion is disposed on a side of the frame packaging region away from the display region, and the monitoring portion is electrically connected to the light emitting elements in the frame packaging region through a connecting line.

13. The display device as claimed in claim 11, wherein the light emitting unit comprises first light emitting elements and second light emitting elements, the first light emitting elements are arranged in odd rows and the second emitting elements are arranged in even rows, the odd rows are paralleled to the even rows, each of the first light emitting elements is staggered with each of the second light emitting elements.

14. The display device as claimed in claim 13, wherein the monitoring portion comprises a first signal loading terminal electrically connected to the first light emitting elements and a second signal loading terminal electrically connected to the second light emitting elements.

15. The display device as claimed in claim 13, wherein the first light emitting elements and the second light emitting elements are evenly distributed in two side of the frame packaging region in a horizontal direction.

16. The display device as claimed in claim 15, wherein distances between the first light emitting elements and the display region and distances between the second light emitting elements and the display region are not equal.

17. The display device as claimed in claim 11, wherein both the monitoring portion and the light emitting unit comprise a thin film transistor layer, and the thin film transistor layer of the monitoring portion and the thin film transistor layer of the light emitting unit are formed by a same process.

18. The display device as claimed in claim 17, wherein the thin film transistor layer is provided on an upper surface of the substrate, and the thin film transistor layer comprises a first buffer layer, a base, a second buffer layer, a composite layer, a first gate insulating layer, a second gate insulating layer, a dielectric layer, and a planarization layer from bottom to top.

19. The display device as claimed in claim 17, wherein the light emitting unit comprises a first light emitting element layer disposed on the thin film transistor layer and corresponding to the display region and a second light emitting element layer disposed corresponding to the non-display region, and the second light emitting element layer comprises an anode, a light-emitting layer, and a cathode that are stacked.

20. The display device as claimed in claim 19, wherein the thin film transistor layer corresponding to the monitoring portion comprises an active layer and an electrode layer that are stacked, the electrode layer comprises a first electrode layer and a second electrode layer disposed at intervals, the anode is electrically connected to the first electrode layer, and signal transmission between the monitoring portion and the first electrode layer is carried out through the anode and the light emitting elements.

* * * * *